(12) United States Patent
Chapman et al.

(10) Patent No.: US 7,549,135 B2
(45) Date of Patent: Jun. 16, 2009

(54) DESIGN METHODOLOGY OF GUARD RING DESIGN RESISTANCE OPTIMIZATION FOR LATCHUP PREVENTION

(75) Inventors: Phillip F. Chapman, Colchester, VT (US); David S. Collins, Williston, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 11/566,922

(22) Filed: Dec. 5, 2006

(65) Prior Publication Data
US 2008/0134104 A1    Jun. 5, 2008

(51) Int. Cl.
*G06F 17/50* (2006.01)
*G06F 9/45* (2006.01)

(52) U.S. Cl. .................. 716/5; 716/1; 716/2; 716/4; 716/6; 703/13; 703/14

(58) Field of Classification Search ................ 716/1–6, 716/18; 703/13–14
See application file for complete search history.

(56) References Cited

U.S. PATENT DOCUMENTS

| | | | | |
|---|---|---|---|---|
| 5,796,638 A | * | 8/1998 | Kang et al. ................ 716/5 |
| 6,157,530 A | * | 12/2000 | Pequignot et al. .......... 361/111 |
| 6,725,439 B1 | * | 4/2004 | Homsinger et al. .......... 716/12 |
| 2006/0092592 A1 | * | 5/2006 | Huang ..................... 361/220 |
| 2007/0008667 A1 | * | 1/2007 | Steinhoff .................. 361/56 |
| 2008/0122473 A1 | * | 5/2008 | Lien et al. ................ 324/765 |

OTHER PUBLICATIONS

Ker, Ming-Dou, et al., "Automatic Methodology for Placing the Guard Rings into Chip Layout to Prevent Latchup in CMOS IC's", IEDM Tech. Dig., 2001, pp. 113-116.

Harame, D. L., et al., "Design Automation Methodology and RF/Analog Modeling for RF CMOS and SiGe BiCMOS Technologies", IBM J. Res. & Dev., vol. 47, No. 2/3, Mar./May 2003.

* cited by examiner

*Primary Examiner*—Paul Dinh
*Assistant Examiner*—Nghia M Doan
(74) *Attorney, Agent, or Firm*—Scully, Scott, Murphy & Presser, P.C.; W. Riyon Harding, Esq.

(57) ABSTRACT

A design methodology is disclosed for optimizing guard ring design by optimizing the guard ring to power supply path resistance value between physical and/or virtual injection sources in a CMOS circuit and the corresponding power supply. By comparing the calculated guard ring to power supply path resistance value to resistance criteria derived from specifications, elements that need further redesign are identified. Repeated redesign with several redesign options eventually lead to an optimized guard ring structure that provides area-efficient and sufficient latchup protection for the CMOS circuit.

2 Claims, 2 Drawing Sheets

DESIGN METHODOLOGY OF GUARD RING DESIGN RESISTANCE OPTIMIZATION FOR LATCHUP PREVENTION

FIELD OF THE INVENTION

The present invention relates to semiconductor circuit design, and more particularly to a circuit design methodology for latchup prevention.

BACKGROUND OF THE INVENTION

In a semiconductor circuitry, latchup is caused by current flowing from a substrate injection source within a guarding structure to adjacent circuitry where parasitic p-n-p-n structure exists. An example of such a parasitic p-n-p-n structure is a CMOS inverter that employs a PFET and an NFET connected in series. To prevent current from I/O drivers into adjacent circuitry, guard rings are placed around I/O circuitry.

Examination of a typical CMOS circuitry shows the origin of the latchup mechanism. PFETs are built in an n-well formed within a P– substrate and NFETs are built in the P– substrate and outside the n-well. The drains of the PFETs and the n-well are both biased with a positive voltage supply, $V_{DD}$, while the source of the NFETs and the P– substrate are both connected to a negative power supply, $V_{SS}$. The negative power supply $V_{SS}$ is often a connection to ground. Between a neighboring pair of a PFET and an NFET, as can be found in a CMOS inverter for example, a parasitic p-n-p-n structure exists between the $V_{DD}$ supply and the $V_{SS}$ power supply formed by the PFET drain, the n-well, the P-substrate, and the NFET source due to their nature as doped semiconductor regions.

This parasitic p-n-p-n structure can be approximated to first order with an equivalent circuit comprising one pnp bipolar transistor, one npn bipolar transistor, and two resistors, wherein the base of the pnp bipolar transistor and the collector of the npn bipolar transistor share the same n-well, and the pnp bipolar transistor and the base of the npn bipolar transistor share the P– substrate. The n-well and P– substrate are both collectors and bases at the same time. In an equivalent circuit approximation, an upper shunt resistor in a parallel connection between the $V_{DD}$ power supply and the base of the pnp bipolar transistor approximates the resistance. This resistance is associated with the resistance between the n-well contact and a p-type device contained within an n-well. Similarly, a lower shunt resistor in a parallel connection between the base of the npn bipolar transistor and the $V_{SS}$ power supply approximates the resistance between the two components. This resistance is associated with the resistance between the p+substrate contact and an n-type device within the substrate. Forward biasing of the parasitic pnp and the npn transistors can lead to a S-type I-V characteristic and turn-on of the pnpn structure. This condition is called "latchup." Latchup should be avoided in semiconductor circuits since it can cause semiconductor chip failure. Reference is herein made to Ker et al., "Automatic Methodology for Placing the Guard Rings into Chip layout to Prevent Latchup in CMOS IC's," IEDM Tech. Dig., 2001, pp. 113-116, which shows an equivalent circuit for the parasitic components of a pnpn structure in FIG. 1(b) for illustration.

Guard rings are utilized to prevent a latchup by improving "internal latchup" and "external latchup" robustness in semiconductor structures and chips. Guard rings are any physical region or shape that improves the latchup robustness of a structure, circuit or chip.

To prevent an internal latchup, guard rings are placed between the pnp and the npn parasitic transistors to electrically de-couple the two parasitic transistors to avoid a regenerative feedback. Guard rings can be reverse biased PN junction diodes placed between the conduction paths of the parasitic p-n-p-n structures. Typically, guard rings consist of connections to both the $V_{SS}$ power supply and the $V_{DD}$ power supply A grounded guard ring is formed by a low-resistance P+ area that connects to $V_{SS}$ power supply. A power supply guard ring is formed by an n-well and an N+ region on the substrate that connects to the $V_{DD}$ power supply.

To prevent an external latchup, guard rings are placed between one sector of a structure, circuit or chip to another sector of a structure, circuit or chip to avoid injection across the sectors. Guard rings can consist of isolation regions or doped regions. In the case of doped regions, these guard rings are biased to a power supply to collect minority carriers injected into a region. When an injection source is present, and the role of the guard ring is to prevent the injection of minority carriers from reaching other regions of the semiconductor chip. In an external latchup condition, the injected minority carriers serve as a virtual external injection source to a region where a p-n-p-n structure exists. For an external latchup guard ring region to be effective, it is important to allow the collection of the extra injected carriers in the substrate to prevent them from reaching the sensitive regions of the semiconductor chip. In this scenario, the resistance of the guard ring must be low enough to allow the collection of large currents without losing its effectiveness. When the voltage drop within the guard ring itself is significant, it can not "sink" the external current from the injection region.

The effectiveness of a guard ring is dependent upon many variables including the following: the width of the guard ring, the depth of the guard ring, the sheet resistance of the guard ring (which is dependent upon the implant conditions), spacing between the injection sources and the guard ring, and substrate doping concentration. If the guard ring resistance itself is high, this can lead to a voltage drop within the guard ring and de-bias the guard ring. The parameters that affect the resistance of the guard ring includes species and dose of the dopants implanted into the guard ring, dopant activation during anneals, the dimensions (width and depth) of the guard ring, the density of guard ring contacts, the resistance of each guard ring contact, the thickness and resistance of silicide film forming contacts, and the metal bus resistance to the $V_{DD}$ power supply grid and to the $V_{SS}$ power supply grid (or the ground grid).

With the continual scaling of semiconductor devices and with a limited number of I/O pads in present day IC's, the guard ring resistance has increased to make the guard ring structures less effective. The problem is that reduced guard ring width, reduced contact density (limited by bussing and manufacturing polish limits), and limitations on the bus location introduce a series resistance with the parasitic lateral npn bipolar transistor formed between an injection source and the guard ring.

As current flows from an injection source in a latchup condition such as an ESD event, the role of the guard ring is to collect the excess current and avoid the current flowing to other chip sectors which may be sensitive to CMOS latchup (e.g. array regions with dense CMOS circuits). As the series resistance increases with the guard ring itself (e.g. which is serving as a npn collector), the biasing of the parasitic lateral npn bipolar transistor is decreased. When the resistance is significant, the lateral bipolar is de-biased leading to the carriers traveling to other locations within the semiconductor chip which may be sensitive to CMOS latchup (e.g. core regions of dense CMOS circuitry, ASIC gate array, etc). However, the role of the guard ring is to prevent injection of minority carriers into other chip regions. Any design or process features that compromise the effectiveness will impact the external guard ring effectiveness of fulfilling this objective and function. Other factors also affect the effectiveness of guard ring structures in preventing a latchup in IC circuits with small device dimensions. These factors include contact density, guard ring resistance, bus resistance, and injection source location dependency. The design parameters between the point of the injection of minority carriers and the power supply influence the ability of the guard ring to "sink" the injection current.

Latchup testing in a CMOS circuit is typically performed by injecting a trigger current of +/−100 mA on the I/O pins to insure that latchup is not triggered under such conditions. Traditionally, guard rings are then manually placed as needed to prevent a latchup. Also, some automated processes of placing guard rings have been known in the art. One such example is shown in Ker et al., "Automatic Methodology for Placing the Guard Rings into Chip layout to Prevent Latchup in CMOS IC's," IEDM Tech. Dig., 2001, pp. 113-116, wherein the guard rings are automatically placed around the power buses. While such automatic placement of guard rings tend to insure that sufficient level of protection against latchup is present in an IC, the large area that such guard ring structures occupy make the design layout less effective in the use of the semiconductor area.

Due to the general degradation of the effectiveness of the guard rings, neither manual placement of guard rings nor automatic placement of guard rings based on the availability of power bus is sufficient to achieve a high level of latchup protection with a minimum semiconductor space usage. Manual placement of guard rings, which tend to be area-effective, is prone to missing some the complexities affecting the effectiveness of guard rings as well as being time-consuming. Automatic placement of the guard rings based on the availability of power buses nearby tend to place more than enough guard rings thus use more semiconductor area than necessary to provide sufficiently high level of latchup protection.

Therefore, there exists a need for a methodology for automatically placing guard rings in a more area-efficient yet effective way.

There exists another need to control the guard ring to power supply path resistance between any injection source (e.g. electrostatic discharge (ESD) device, diffusion, or external ionizing radiation region) and the guard ring region.

There exists yet another need to provide an alternate design option when the guard ring to power supply path resistance exceeds a preset limit.

SUMMARY OF THE INVENTION

To address the needs described above, the present invention provides a methodology of checking an IC design for parameters for determining sufficiency of protection against latchup, verifying the parameters by comparing them against specifications, and providing at least one redesign option to bring out-of-spec parameters into compliance with the specification.

According to the present invention, the following steps are used to optimize the IC design to insure that the final design has sufficient protection against latchup.

1. Each injection source is identified with an "injection shape."
2. Identify the "guard ring injection intersection" loci of points. This represents the identification of the parasitic bipolar transistors between the injection shape and a guard ring. In this process, a position and location is defined on the guard ring structure at the point of current injection. Various methods will be disclosed on the definition of this location.
3. The "guard ring to power supply path" resistance value between the structures forming parasitic bipolar transistors and a corresponding power supply pad is calculated.
4. Based on specifications, resistance criteria for each of the guard ring to power supply path resistance value calculated above is defined.
5. Each of the guard ring to power supply path resistance value is checked against the resistance criteria (e.g. which can be a corresponding maximum resistance number).
6. For each of the guard ring to power supply path resistance value that exceeds the corresponding maximum resistance number, a re-design is performed on at least one of the circuit elements affecting the guard ring to power supply path resistance value.
7. The steps (c) through (f) are repeated until each of the guard ring to power supply path resistance value is less than the corresponding resistance criteria (e.g., maximum resistance number).

According to the present invention, to reduce the guard ring to power supply path resistance value that exceeded the resistance criteria (e.g. corresponding maximum resistance number) through a re-design, the re-design as described in step (f) above utilizes at least one option from the following:

1. Adjusting spacing between a guard ring and an injection shape.
2. Widening the guard ring width.
3. Increasing guard ring contact density.
4. Widening a power bus in a metal level.
5. Introducing new guard ring type.
6. Changing design parameters of the "guard ring parameterized cell (PCell)."
7. Decreasing the size of the injection source (e.g. ESD network).

Most of the steps described in the above methodology can be automated using a computer program. Thus, an automated system for checking, verifying, and optimizing a guard ring design is enabled though controlling the guard ring to power supply path resistance value from the components of parasitic bipolar transistor to the power supply and to the $V_{SS}$ power supply.

BRIEF DESCRIPTION OF THE DRAWINGS

FIG. 2 shows an exemplary guard ring structure that the present invention can be used on.

DETAILED DESCRIPTION OF THE INVENTION

Figure 1:
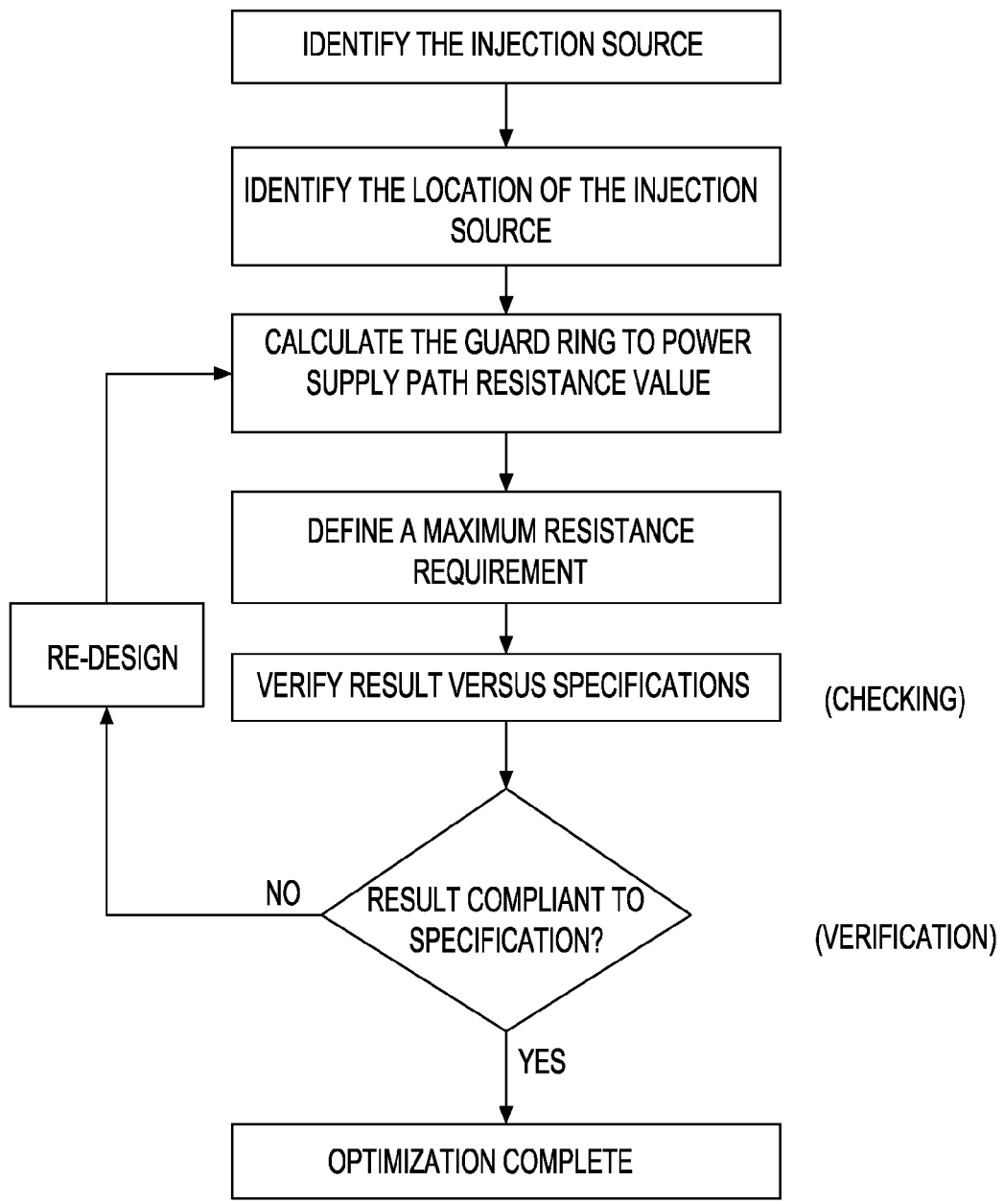
FIG. 1 shows a flow chart for the design methodology for optimized guard ring design according to the present invention.

The present invention is herein described in detail with accompanying figures. Referring to FIG. 1, a flowchart showing the overall design methodology for optimizing guard ring design according to the present invention is shown.

According to the present invention, the injection sources are defined with an "injection shape." This injection shape can be a real or virtual design level in the physical chip design. A real design shape can be a real mask design shape forming a shape in the silicon chip, whereas a "virtual design shape" can be a design level with no real shape defined in the silicon chip.

There are also different forms of injection sources. A first form of injection source is the placement of any N+ doped region in a p-substrate region. This may comprise of an n-diffusion of an N-diffusion-to-P-substrate diode, a N-well to substrate diode, an n-diffusion resistor, or an n-channel MOSFET device. With the a negative polarity applied to the N+ doped region, the diffusion forward biases injecting current into the p-substrate region. Note that this injection process can also include N+ doped regions electrically connected to input signal pads or to power supply regions. In addition, a second form of injection source is the placement of any P+ doped region in an N-well region. In this case, any forward bias injection of the P+ region into the N-well region can lead to collector current and injection into the substrate region and to the adjacent guard ring structure. Note that this injection can include P+ doped regions electrically connected to input signal pads or to power supply regions. In the case of these two types of injection sources, the injection source can be a real shape.

There are other forms of injection sources such as external radiation sources (e.g. cosmic rays, heavy ion particles, alpha particles, and ionizing sources). In the case of ionizing radiation sources, the injections shape can be a virtual shape. In a general respect, the external injection source can be any form of injection where the physical space and area can be defined.

The following feature also defines another "injection shape." The injection shape can be a real physical shape or a virtual shape. In the case of a physical diffusion, the shape is an actual physical region as described above. In the case of an external injection phenomenon, this physical injection region can be a virtual shape with no physical diffusion. Hence in a general aspect of the invention, the "injection shape" is a virtual design level that allows spatial definition of the region where the injection phenomenon occurs. As such, a single injection shape or a plurality of injection shapes can be defined. According to the present invention, all such elements are marked as injection shapes. Preferably, but not necessarily, other criteria for identifying injection shapes more accurately and effectively may be introduced to an injection shape recognition algorithm.

Once each injection shape is identified, a spatial location on the guard ring is identified between the injection shape and a guard ring. In this process, from the injection shape, the nearest point of intersection to the guard ring is identified.

Figure 2:
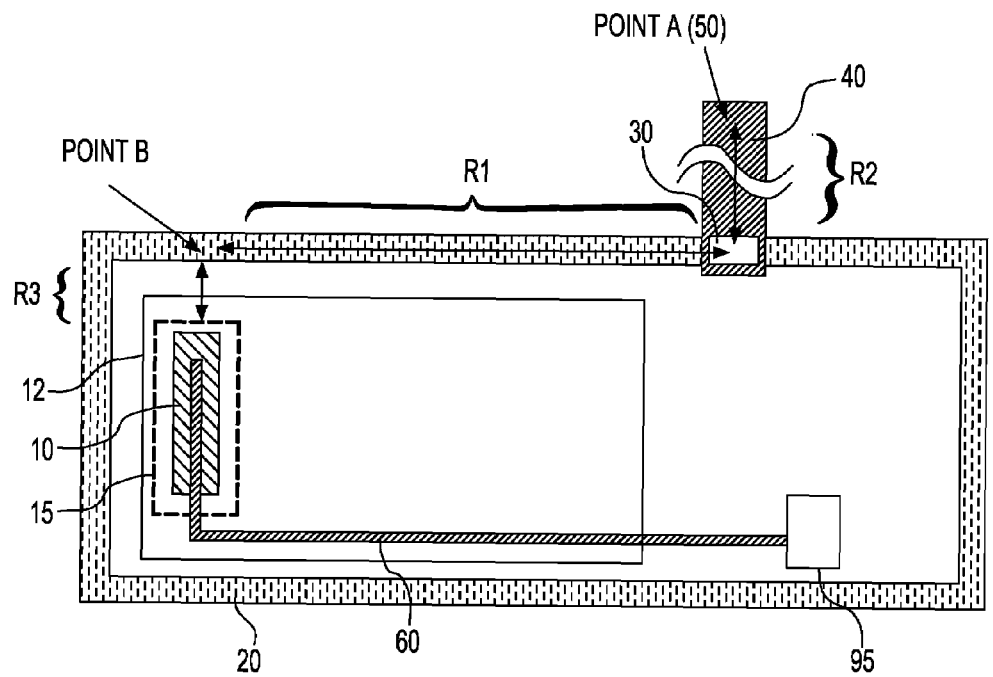

Referring to FIG. 2, the location on the guard ring 20 can be a single point on the guard ring 20 which is the shortest distance between the injection shape 10 and the inner edge of the guard ring 20. Hence, at least one point on the guard ring 20 is identified which is the nearest point to the injection shape 10.

From each point on the injection edge, i.e., the edge of an injection shape, a loci of points can be defined where there is a one-to-one correspondence to the nearest point on the guard ring inner edge which is the shortest distance between the two points. Hence, there may be a plurality of points where injection can occur and a corresponding plurality of points on the guard ring 20 where the injection current is collected. From these plurality of points on the guard ring, a point nearest point to the power supply (Point A) is selected and defined as "guard ring injection intersection point" (shown as point B in FIG. 2). The guard ring injection intersection point is the lowest resistance point in the guard ring structure where the current is injected and can be used for the resistance criteria. The corresponding point on the injection edge is defined as "injection point" (shown as point C in FIG. 2)

According to the methodology of the present invention, the region of injection can be a plurality of injection shapes or a plurality of loci of points where the injection occurs. As a result, the methodology can address a summation of locations for the effective resistance calculation from the plurality of points back to the power supply. Hence, resistance criteria can be established to address the acceptable resistance values back to the power supply rail.

According to this method, the loci of points and the injection levels can be used to evaluate the voltage drops within the guard ring structure. Due to the distributed nature of the current flow, the resistance criteria can address the current flow over a region of loci of points on the guard ring structure and evaluate the voltage drops based on a current level, defining what is the acceptable resistance allowed to avoid the reduction in the effectiveness of the guard ring to prevent current from flowing outside the guard ring structure. The acceptable current level to avoid CMOS latchup based on the JEDEC specification (e.g. 100 mA) is well known in the art. From the known current criteria for latchup, the acceptable voltage and resistance values are defined.

For example, given an N+ region within a P− substrate, a P− substrate, and a N+ guard ring region, a parasitic bipolar transistor is formed between the N+ region (emitter), p−substrate (base) and the N+ guard ring (collector). The dimensions of the components of each parasitic bipolar transistor are calculated from the design layout. In a CMOS circuit built on a P− substrate, the base of a parasitic lateral bipolar pnp transistor is the n-well in which the drain of a PFET is located and the base of a parasitic lateral bipolar npn transistor is the P− substrate in which the source of an NFET is located. Preferably but not necessarily, the structure recognition algorithm of FIG. 1 may include other filters to identify key structural components for optimizing the design for prevention of latchup while ignoring inconsequential structural components that do not affect latchup mechanism substantially.

In the next step depicted in FIG. 1, the guard ring to power supply path resistance value is calculated between the injection shape and a $V_{DD}$ power supply pad or a $V_{SS}$ power supply pad. For the description of the present invention, both the $V_{DD}$ power supply pad and the $V_{SS}$ power supply pad are considered a power supply pad. A pad connected to ground is a $V_{SS}$ power supply pad that happens to supply zero volts. In the cases of a physical injection shapes, of special importance is the guard ring to power supply path resistance value between the base of a parasitic lateral bipolar npn transistor collector and the $V_{DD}$ power supply pad and the guard ring to power supply path resistance value between the base of a parasitic lateral bipolar pnp transistor collector and the $V_{SS}$ power supply pad. In the cases of virtual injection shapes, the mechanism of the virtual injection of current readily identifies the power supply of concern between the $V_{DD}$ power supply and the $V_{SS}$ power supply. Since the type of injection shape transistor identifies the power supply of concern, the power supply pad associated with the selected component of the parasitic bipolar transistor as described above is called the "corresponding" power supply pad. In other words, based on the structure of the parasitic circuit described above, once a structural component of a parasitic bipolar transistor is identified, the power supply pad "corresponding" to that structural component is determined automatically.

FIG. 2 shows an exemplary structure wherein is the guard ring to power supply path resistance value is calculated between a physical injection source 10 (and a corresponding injection shape in a virtual design level) and a $V_{DD}$ power supply pad 50, which is also labeled as Point A. The injection source 10 is part of Circuit A 12 within a guard ring 20, and is powered by Circuit A power pad 95. Guard ring 20 is connected to a $V_{DD}$ power bus 40 through guard ring contacts 30. The $V_{DD}$ power bus 40 extends to the $V_{DD}$ power supply pad 50 (not explicitly shown but the location is marked with a pointer arrow in FIG. 2; see FIG. 3 for further details). The guard ring injection intersection point as defined above is shown as Point B is shown in FIG. 2.

While FIG. 2 shows a physical injection shape 10 and the corresponding guard ring injection intersection point (point B), the same calculation for the location of a guard ring injection intersection point may be performed solely based on a virtual injection shape that is represented as an injection shape instance 15 in a virtual design level that allows spatial definition of the region where the injection phenomenon occurs. Notice that a virtual injection shape does not require a physical structure for an injection source but only the knowledge that a phenomenon equivalent to a physical injection source does nor may exist in a defined area. The injection shape instance 15 for a virtual injection shape, in this case, is an instance present only in a design of an IC chip but does not necessarily have a physical structure.

Also shown in FIG. 2 are a P-substrate contact 19 which is connected to ground, an N-well region 61 which containing a P-type device 62 such as a PMOSFET, and an N-well contact 69 for the N-well region 61. Various resistance paths are shown including the resistance R2 between the $V_{DD}$ power supply pad 50 and the guard ring contacts 30, the resistance R1 between the guard ring contacts 30 to the guard ring injection intersection point (point B), the resistance R3 between the guard ring injection intersection point and The injection point (point C), the resistance between the injection source and the P-substrate contact (not shown), the resistance between the N-well contact and the P-type device. The present invention controls the resistance between The injection point (point C) and the $V_{DD}$ power supply pad 50 (point A). This resistance is defined as "guard ring to power supply path" resistance and is mathematically equal to The sum of R1 an R2. (The sum of R1 and R2 includes the resistance of the guard ring contacts 30.) In this invention, the resistances of R3, R4 or R5 does not have a bearing on the resistance values of interest, The sum of R1 and R2.

Guard ring to power supply path resistance values can be calculated by extracting the dimensions and resistivity of the material from the design layout with an automated path resistance extraction algorithm. The guard ring to power supply path resistance value includes all components of resistance in the path between the two ends including the resistance of the guard ring, the resistance of the contacts, and the resistance of the power bus or the $V_{SS}$ power supply bus.

In a next step, a resistance requirement for the guard ring to power supply path resistance is derived, or "defined" based on the specifications for protection against latchup and the voltage drops that are acceptable in the guard ring to still function. Whereas the resistance of well and substrate contacts spacing can be obtained from the generalized differential tetrode relationship, in this case, the analytical development is associated with the external injection phenomenon and the guard ring efficiency (e.g. not related to the well and substrate shunt resistance issues). The quantity to be calculated in this step is the allowable path resistance between the guard ring and the power supply, that is, the guard ring to power supply path resistance.

The calculated path resistance value is then compared with the corresponding resistance criteria. This is a numeric comparison of two values for each comparison and can readily be automated.

A guard ring to power supply path resistance value that is under the corresponding resistance criteria requirement verifies the portion of the design pertaining to the corresponding path resistance value. A guard ring to power supply path resistance values that exceed the corresponding resistance criteria identifies, or "flags," the failure of the guard ring structure which will require a redesign.

According to the present invention, the guard ring is redesigned in order to lower the effective resistance and improve the guard ring effectiveness. After the redesign, the calculation of the new guard ring to power supply path resistance values, corresponding redefinition of the resistance criteria if applicable, the comparison and reverification of the design follow. Since a redesign of one portion or total may indirectly affect another portion, reverification of all components of the design is in general necessary. Optionally, however, an algorithm may exclude reverification of a portion of a design if the redesign is deemed to have a minimal impact on the unaltered portion of the design. This iteration process can also be automated.

Several options exist for redesign of components of the parasitic bipolar transistors and the guard ring. At least one method is employed according to the present invention for each component that produced a failing guard ring to power supply path resistance value in the prior round of checking and verification. However, more than one method may be simultaneously be used during a redesign. The redesign part of this methodology can also be automated.

Several redesign methods are available according to the present invention during the redesign stage which comprise:
1. Adjusting the spacing between a guard ring and an injection shape.
2. Widening the width of the guard ring.
3. Increasing contact density of the guard ring.
4. Widening the $V_{DD}$ power supply bus or the $V_{SS}$ power supply bus in a metal level.
5. Introducing new guard ring type.
6. Changing design parameters of the guard ring PCell (e.g. new shapes, number of shapes, structures or type of guard ring region)
7. Decrease the size of the injection source (e.g. ESD network) to decrease the injection level.

The first method of adjusting the guard ring spacing is used to increase the bipolar current gain of a parasitic lateral bipolar transistor. Such an increase in the bipolar current gain of the bipolar transistor can compensate for the high path resistance value from a component of the bipolar transistor to a power supply pad. In the case of the external latchup guard ring structure, it is desired to "sink" the current to the guard ring to avoid the current flow to undesirable locations. Hence, any physical means of improving the collection efficiency of the collector structure is desirable. This is achievable by physical new semiconductor process shapes or different guard ring structures. Any semiconductor process solution or structure that improves the efficiency of collection is desirable.

The second method of widening the guard ring reduces the resistance of the guard ring itself, thereby reducing the guard ring to power supply path resistance value. The collector efficiency can be improved by the reduction of the series resistance to the power supply. This can be achieved by widening of the N-well region, or widening of the N+ region of the guard ring structure. This can be achieved with the use of additional implants and process steps.

The third method of increasing the contact density decreases the resistance of the contacts to the N+ doped contacts in the n-well or the resistance of the contacts to the P+ doped contacts in the P− substrate, thereby reducing their contribution to the guard ring to power supply path resistance value. By placement of parallel or series contacts between the power supply and the point of injection will lead to lower series resistance.

The fourth method of widening a power bus in a metal level decreases the resistance of the power bus so that their contribution to the guard ring to power supply path resistance value is also reduced. The finite width of the physical power bus structure results in a finite resistance and a finite voltage deviation in the circuit from the supplied voltage at the power supply pad. By widening the power bus, their contribution to the guard ring to power supply path resistance value is also decreased.

The fifth method of introducing a new guard ring type substitutes an existing guard ring structure with a new one with improved collection efficiency or lower resistance. Typically, guard rings occupy a significant area of a semiconductor substrate and therefore they are designed with maximum area efficiency achievable during the design phase to use as little semiconductor area as possible. If one type of guard ring does not provide sufficient protection against latchup, a larger guard ring may be substituted at the expense of less area efficiency. As examples, new guard rings can be used to lower the resistance and improve the collection characteristics of the guard rings. The following guard rings can be modified to the following:

Trench guard rings
N-wells and trench guard rings
N-wells and sub-collector guard rings
N-wells, sub-collectors, and trench guard rings
N-wells, sub-collectors, and triple well buried layers
N-wells, sub-collectors, triple well buried layers and trench guard rings The sixth method of changing parameters of guard ring parameterized cell (note: also known as a PCell) adjusts the design of the PCell used in the guard ring design. PCells are programmable component layouts that may be stretched through parameter inputs. The PCell is designed in accordance with process design rules, and, when placed, the component complies with the design rules by construction. The design rules may be input into the database for access by all tools within the framework. These rules are input into the PCell as variables that enable easy migration to technologies with a database update. Layout options can be passed to the PCell as optional parameters in the design. A discussion on the use of a PCell is provided in Harame et al., "Design automation methodology and rf/analog modeling for rf CMOS and SiGe BiCMOS technologies," IBM J. RES & DEV., Vol. 47, No. 2/3, March/May 2003. By changing the built-in parameters in the PCells, the design is altered to be compliant to the specifications for protection against latchup. In the guard ring parameterized cell (Pcell), the parameters in the Pcell can be modified or the type of guard ring structure. Using the graphical unit interface (GUI), new structures and parameters will allow the modification of the guard ring to improve its collection efficiency and lower the series resistance. Examples are as below:

Trench guard rings
N-well and trench guard rings
N-well and sub-collector guard ring
N-well, sub-collector, and trench guard ring
N-well, sub-collector, and triple well buried layer
N-well, sub-collector, triple well buried layer and trench According to the methodology of the present invention, given failure of the resistance requirement, and failure of other latchup criteria, an automated graphical unit interface (GUI) can allow automated methods of changing the physical type of guard ring structure. The guard ring efficiency physics and the resistance criteria can be placed into the algorithm to address adequate guard rings to avoid CMOS latchup. In the present design methodology, the guard ring type can be used to achieve an improved collection efficiency (e.g. guard ring efficiency) and a lower guard ring resistance.

The seventh method of decreasing the size of the injection source (e.g. such as the ESD network) can be employed to decrease the injection level according to the specifications since a smaller size of ESD networks have less probability of being subjected to an injection event involving large currents.

The seven methods of redesign are used alone or in combination to rectify the portions of the design that were not compliant to the specification for protection against CMOS latchup during the previous round of checking and verification. As shown in FIG. 1, the processes can be reiterated until a satisfactory guard ring design finally passes all specifications.

Figure 3:
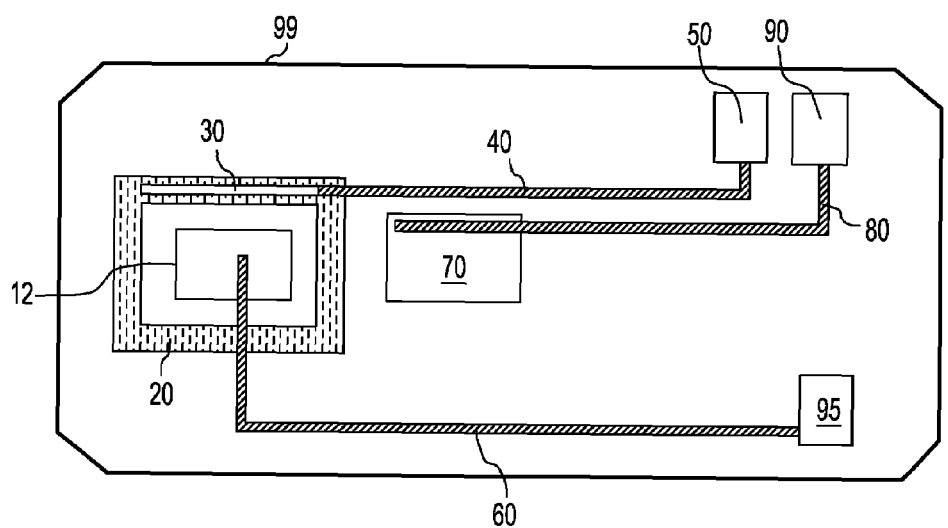
FIG. 3 is an exemplary guard ring structure for an IC chiplet according to the present invention.

The implementation of the present invention results in an optimized guard ring structure. FIG. 3 is an exemplary guard ring structure for an IC chiplet containing a circuit A 12 placed within a guard ring 20 and a circuit B 70 placed outside the guard ring 20. Circuit A 12 in FIG. 3 may contain an injection shape 10 shown in FIG. 2. Both Circuit A 12 and circuit B 70 are placed inside a chiplet guard ring 99. Circuit A 12 is powered by a Circuit A power bus 60 which is then connected to a Circuit A power pad 95. An I/O pad 90 is connected to a circuit B bus 80, which in turn is connected to circuit B 70. The guard ring 20 is contacted by guard ring contacts 30, which are connected to a $V_{DD}$ power bus 40 extending to the $V_{DD}$ power supply pad 50.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A computer implemented method of optimizing a guard ring design to prevent latchup comprising the steps of:
providing, at a computer device, a circuit design including at least one circuit element and a guard ring;
calculating, at a computer device, a path resistance value between a structure that forms an injection source and a corresponding power supply pad, wherein said injection source is one of a P+ doped region placed in an N-well region and a N+ doped region placed in a P-well region, wherein said injection source is a part of a circuit within said guard ring and powered by another power supply pad, wherein said guard ring is connected to said corresponding power supply pad, and wherein said path resistance value includes a first resistance value for resistance between a guard ring injection intersection point and guard ring contacts, a second resistance value for resistance of a portion of a power bus measured between said corresponding power supply pad and said guard ring contacts, and a third resistance value for resistance between said guard ring injection intersection point and said injection source;

checking, at a computer device, said path resistance value against a corresponding resistance criteria; and performing, at a computer device, a redesign on said at least one circuit element if said path resistance value exceeds said corresponding resistance criteria, wherein said at least one circuit element affects said path resistance value, wherein said redesign performed at a computer device, utilizes at least one method selected from the group consisting of the following:

adjusting the spacing between a guard ring and an injection shape;

widening the width of said guard ring;

increasing contact density in said guard ring;

widening a VDD power supply bus or a VSS power supply bus in a metal level;

introducing new guard ring types, wherein said new ring types are selected from the group consisting of trench guard rings; N-wells and trench guard rings; N-wells and sub-collector guard rings; N-wells, sub-collectors, and trench guard rings; N-wells, sub-collectors, and triple well buried layers; and N-wells, sub-collectors, triple well buried layers and trench guard rings;

changing design parameters of said guard ring PCell; and decreasing the size of an injection source.

2. The method of claim 1, wherein at least one of said steps are repeated more than once.

* * * * *